United States Patent [19]
Yamanishi et al.

[11] Patent Number: 5,173,955
[45] Date of Patent: Dec. 22, 1992

[54] MAGNETOOPTIC DEVICE AND ITS DRIVING METHOD

[75] Inventors: Masamichi Yamanishi, Hiroshima; Hitoshi Oda, Sagamihara, both of Japan

[73] Assignee: Canon Kabushiki Kaisha, Tokyo, Japan

[21] Appl. No.: 658,328

[22] Filed: Feb. 20, 1991

Related U.S. Application Data

[63] Continuation-in-part of Ser. No. 519,178, May 4, 1990, Pat. No. 5,101,469.

[30] Foreign Application Priority Data

May 8, 1989 [JP] Japan ................................. 1-113674
Feb. 20, 1990 [JP] Japan ................................. 2-39265

[51] Int. Cl.$^5$ ............................................. G02B 6/10
[52] U.S. Cl. ........................................ 385/6; 385/8; 385/131
[58] Field of Search ............... 350/96.12, 96.13, 96.14, 350/96.15; 385/2, 6, 8, 3, 131; 359/276; 372/45; 357/4, 30 E, 27, 63

[56] References Cited

U.S. PATENT DOCUMENTS

| | | | |
|---|---|---|---|
| 4,706,103 | 11/1987 | Ranganath | 350/96.14 X |
| 4,746,182 | 5/1988 | Dammann et al. | 350/96.14 X |
| 4,837,526 | 6/1989 | Suzuki et al. | 350/96.14 X |
| 4,865,427 | 9/1989 | Kingston et al. | 350/96.14 X |
| 4,877,298 | 10/1989 | Teng et al. | 350/96.14 |
| 4,889,402 | 12/1989 | Reinhart | 350/96.14 |

Primary Examiner—John D. Lee
Assistant Examiner—Phan T. Heartney
Attorney, Agent, or Firm—Fitzpatrick, Cella, Harper & Scinto

[57] ABSTRACT

There is provided a magnetooptic device including a substrate; a semiconductor layer having a quantum well structure formed on the substrate, in which the semiconductor layer is formed by alternately laminating a well layer and a barrier layer and at least the barrier layer in those layers contains magnetic ions; and electrodes to apply an electric field to the semiconductor layer. A light which was polarized in a predetermined direction is input to the semiconductor layer. A magnetic field is applied to the semiconductor layer. An electric field is applied to the semiconductor layer by the electrodes. The light which was transmitted in the semiconductor layer is extracted. A degree of leakage of a wave function of the carrier in the well layer into the barrier layer changes. An effective magnetic field which a carrier spin feels changes by an exchange interaction between the carrier spin and a magnetic moment associated with the magnetic ions. Thus, a degree of magnetooptic effect which is given to the transmission light changes. The degree of manetooptic effect can be controlled by the applied electric field. The magnetooptic device is preferably used as an optical modulator or an optical isolator in the field of optical communications or optical memories.

42 Claims, 8 Drawing Sheets

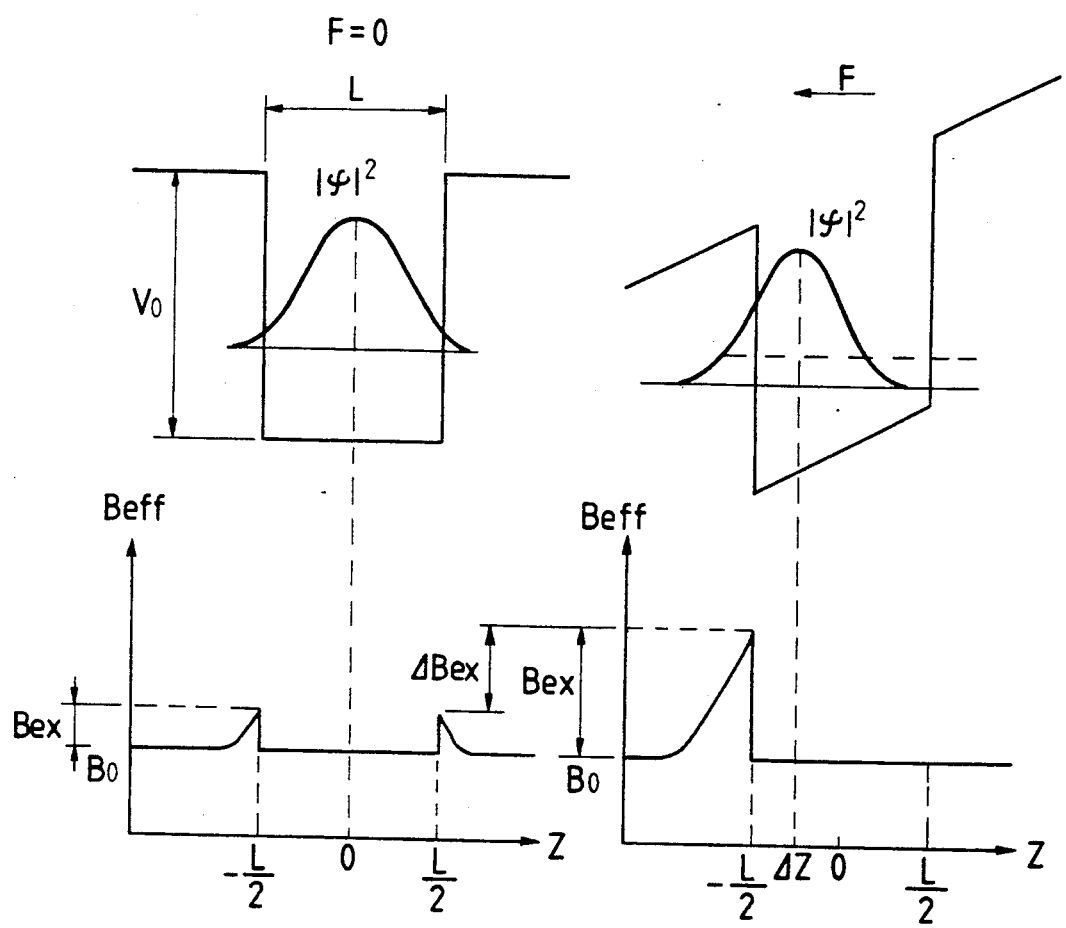

MAGNETOOPTIC DEVICE AND ITS DRIVING METHOD

This application is a continuation-in-part of copending application, Ser. No. 07/519,178, filed May 4, 1990 (U.S. Pat. No. 4,101,469).

BACKGROUND OF THE INVENTION

1. Field of the Invention

The present invention relates to a magnetooptic device to control a degree of a magnetooptic effect by applying an electric field and to a method of driving such a device. The magnetooptic device of the invention is suitably used as, for instance, an optical modulator or an optical isolator in the field of optical communication or an optical memory.

2. Related Background Art

In recent years, optical fiber communication using a semiconductor laser or the like as a light source and an optical memory using an optical disk, a magnetooptic disk, or the like have been developed in association with the realization of a high transmission speed of information and a large recording capacity of information. Those systems need an optical device having a variety of functions.

For instance, in the optical communication such as an optical fiber communication or the like, a system using an external optical modulator to further increase a bit rate is studied. According to such a system, since the semiconductor laser is DC driven, an optical pulse train of a narrow spectrum width and a high quality can be obtained.

As specifications of such an optical modulator, it is required that a high speed modulation of about 10 Gbps can be performed and a large modulation amplitude of 10 dB or more is provided. An optical modulator having a structure which satisfies such specifications and is suitable for further miniaturization and high integration is now being developed. However, the development is still insufficient.

On the other hand, in the above optical communication and optical memory, an instability of the oscillation and noises due to the return light of the semiconductor laser always cause a problem. An optical isolator is known as only one device to completely prevent that such a return light enters the semiconductor laser. High integration and miniaturization of the optical isolator and the semiconductor laser are now being studied. However, there are still several problems with respect to such a study.

A conventional example of the above optical modulator and the optical isolator will now be further practically described hereinbelow.

An optical modulator using a quantum confined Stark effect (QCSE) has been proposed in "Quantum Electron", IEEE J., Vol. QE-21, page 117, 1985, "Quantum Electron", IEEE J., Vol. QE-21, page 1462, 1985, or the like. FIG. 1 shows a schematic cross-sectional view of an example of such an optical modulator.

In FIG. 1, an n+-AlGaAs layer 62, an intrinsic (i-) multiple quantum well (MQW) layer 63, and a p+-AlGaAs layer 64 are sequentially formed as films on an n+-GaAs substrate 61. A hole to transmit the light is formed in the substrate 61 by a selective etching process. Electrodes 66 and 65 are formed under the lower surface of the substrate 61 and on the p+-AlGaAs layer 64, respectively.

The i-MQW layer 63 is constructed by alternately laminating a GaAs layer as a well layer and an AlGaAs layer as a barrier layer. When an inverse-bias voltage is applied to a pin structure constructed as mentioned above, as shown in FIG. 2, as a value of the applied voltage increases, an exciton absorption peak decreases and an absorption edge moves to the long wavelength side, that is, what is called a red-shift occurs.

Therefore, as shown in A or B in FIG. 2, by setting a wavelength of an input light to the device to a predetermined value and by changing the voltage which is applied to the device, a transmittance of the input light of a set wavelength λ can be changed as shown in FIGS. 3A to 3D. The optical modulator of FIG. 1 intends to modulate a transmission light amount by using such an effect.

On the other hand, a device which is constructed by integrating a semiconductor laser and an external optical modulator has been proposed in "Japan J. Applied Physics", Vol. 24, L442, 1985. FIG. 4 shows a schematic perspective view of such device.

In FIG. 4, reference numeral 77 denotes an n+-GaAs substrate; 76 an n+-GaAs layer; 75 an n-$Al_yGa_{1-y}As$ layer (y=0.3); 79 an MQW layer; 74 a p-$Al_yGa_{1-y}As$ layer (y=0.3); 73 an $Si_3N_4$ layer; 72 a p+-GaAs layer; 78 an n-type electrode; and 71 a p-type electrode. A stripe-shaped optical waveguide is formed by mesa-etching the upper portion of the n+-$Al_yGa_{1-y}As$ layer 75. The device is separated into a laser section 91 and a modulator section 92 by a groove 93.

As mentioned above, the laser section 91 and the modulator section 92 have the same pin structure. The waveguides of those sections are optically coupled. Therefore, the light emitted from the laser section 91 enters the waveguide of the modulator section 92 and is waveguided by a predetermined distance and, thereafter, it is emitted. At this time, by applying an inverse-bias voltage to the modulator section 92, the waveguided light is absorbed by the foregoing QCSE in accordance with the applied voltage value. That is, an intensity of the light which is emitted from the modulator section 92 can be modulated by the control of the applied voltage.

FIG. 5 shows a conventional example of the optical isolator. A material having a large magnetooptic effect such as a paramagnetic glass 101 is put into a hollow cylindrical permanent magnet 102 and a magnetostatic field H is applied to the glass 101. A laser beam 105 which becomes a linear polarization light by passing through a polarizing plate 104 is input to the glass 101. In this case, a polarizing direction of the laser beam 105 is rotated by 45° by a Faraday effect when the laser beam transmits the paramagnetic glass 101.

A polarizing plate 103 on the emission light side is arranged so that an angle between a main axis of the polarizing plate 103 and a main axis of the polarizing plate 104 on the incident light side is set to 45°. Therefore, the laser beam 105 whose polarizing direction was rotated as mentioned above directly passes through the polarizing plate 103. On the other hand, the polarizing direction of the return light which enters from the side of the polarizing plate 103 is also rotated for a period of time when the return light passes through the polarizing plate 103 and reversely moves in the paramagnetic glass 101. An angle between the polarizing direction of the return light and the main axis of the polarizing plate 104 on the incident light side is set to 90°. Thus, the return light cannot pass through the polarizing plate 104 on the incident side and is cut.

An isolation ratio (of a degree such as to cut the return light) of the device depends on the Faraday rotation angle. The Faraday rotation angle $\theta_F$ is given by $$\theta_F = VlH$$

when the light passes through a material such as an above paramagnetic glass having a length of l. In the above equation, V denotes a Verdet's constant and H indicates a magnitude of an external magnetic field. At this time, to set the angle $\theta_F$ to 45° in order to maximize the isolation ratio, it is necessary to accurately adjust the length l of the paramagnetic glass 101 and the magnetostatic field H by the permanent magnet 102.

However, the above conventional device has the following problems.

First, there is a problem such that the modulation amplitude of the optical modulator as shown in FIGS. 1 to 4 is shallow. For example, the modulation amplitude is merely about 50% (3 dB) as shown in FIGS. 3A to 3D. In the case of using the optical modulator for the optical communication or the like, a modulation amplitude of at least 10 dB or more is generally necessary. Therefore, it is a present situation that the foregoing optical modulator is not used as a practical device.

There is also a problem such that the optical isolator as shown in FIG. 5 must be manufactured at a high dimensional accuracy by using a material having a large magnetooptic effect. It is also necessary to accurately control the external magnetic field. That is, the values of l and H must be accurately set so as to set the Faraday rotation angle $\theta_F$ to 45° at a high precision.

SUMMARY OF THE INVENTION

It is an object of the present invention to solve the problems of the conventional techniques as mentioned above and to provide a magnetooptic device which can control a degree of magnetooptic effect by applying an electric field and also to provide a method of driving such a device.

The above object of the invention is accomplished by a magnetooptic device comprising: a substrate; a semiconductor layer of a quantum well structure formed on the substrate, in which the semiconductor layer is formed by alternately laminating a well layer and a barrier layer and at least the barrier layer in those layers contains magnetic ions; and an electrode to apply an electric field to the semiconductor layer.

On the other hand, the above object is also accomplished by a method of driving the above magnetooptic device, comprising the steps of: inputting a light which is polarized in a predetermined direction to the semiconductor layer; applying the electric field to the semiconductor layer by the electrode; and extracting the light which is transmitted through the semiconductor layer.

According to the invention, by applying the electric field from the electrode to the semiconductor layer, a magnitude of the leakage of a wave function of the carrier in the well layer into the barrier layer changes and an effective magnetic field which a carrier spin feels changes by an exchange interaction between the carrier spin and the magnetic moment associated with the magnetic ions. Thus, a degree of magnetooptic effect which is given to the light which is transmitted in the semiconductor layer changes.

By applying the invention, an optical modulator having a larger modulation amplitude than that in the conventional device can be realized. By applying the invention to the optical isolator, the polarizing direction of the light can be adjusted by applying an electric field. Therefore, there is no need to accurately control an intensity of the external magnetic field and a manufacturing precision of the isolator which is required is also lightened.

BRIEF DESCRIPTION OF THE DRAWINGS

FIG. 7A is a diagram showing a distribution of a wave function of the carrier and an effective magnetic field intensity in the device of the invention in a state in which no voltage is applied;

FIG. 7B is a diagram showing a distribution of a wave function of the carrier and an effective magnetic field intensity in the device of the invention in a state in which a voltage wave is applied;

DETAILED DESCRIPTION OF THE PREFERRED EMBODIMENTS

The operation principle of a magnetooptic device of the invention will be first described.

Figure 1:
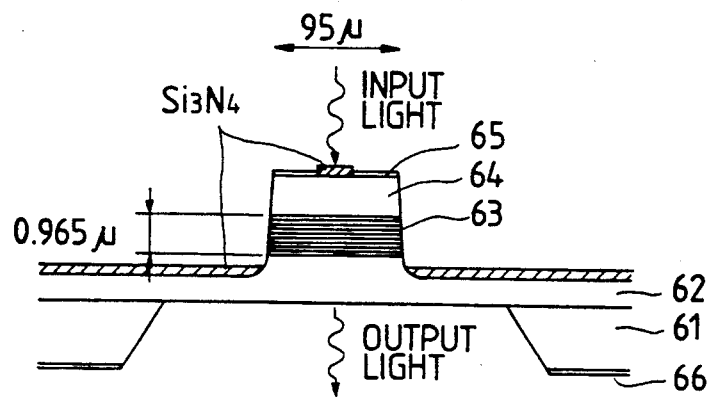
FIG. 1 is a schematic cross-sectional view showing an example of a conventional optical modulator.
Figure 2:
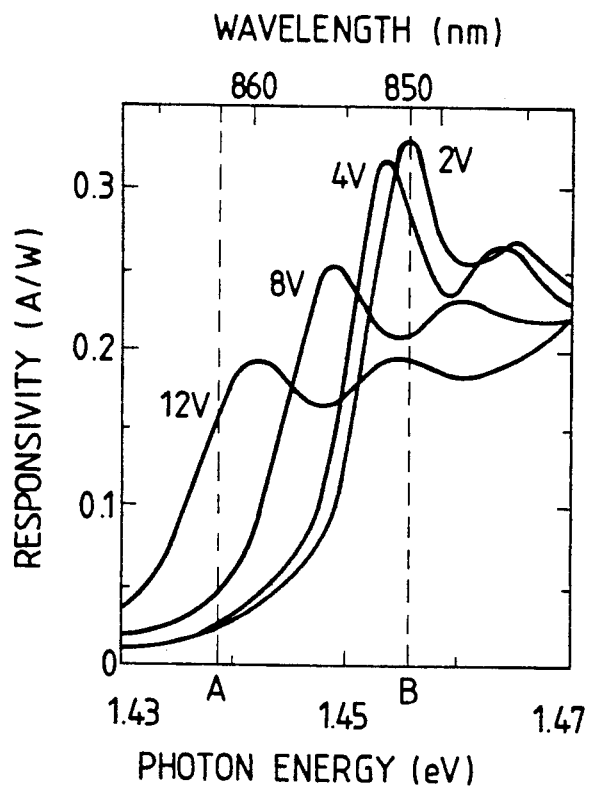
FIG. 2 is a diagram showing a light absorption spectrum of the optical modulator in FIG. 1.
Figure 3A:
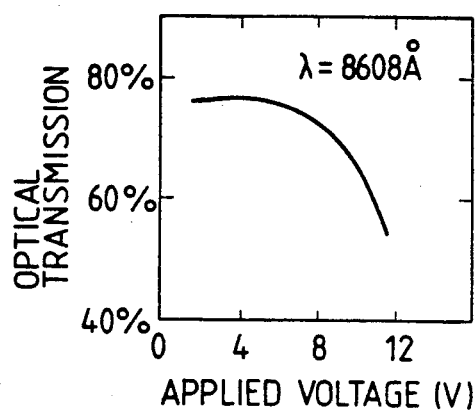
FIGS. 3A to 3D are diagrams showing the relation between the applied voltage and the transmittance in the optical modulator of FIG. 1.
Figure 3B:
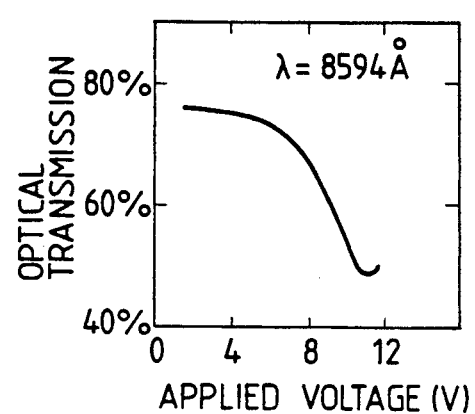
Figure 3C:
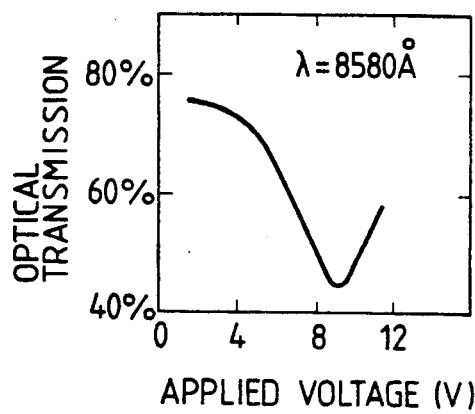
Figure 3D:
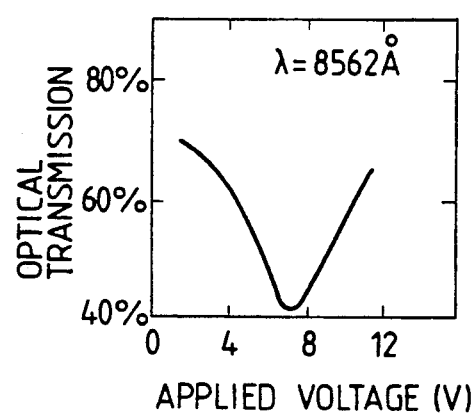
Figure 4:
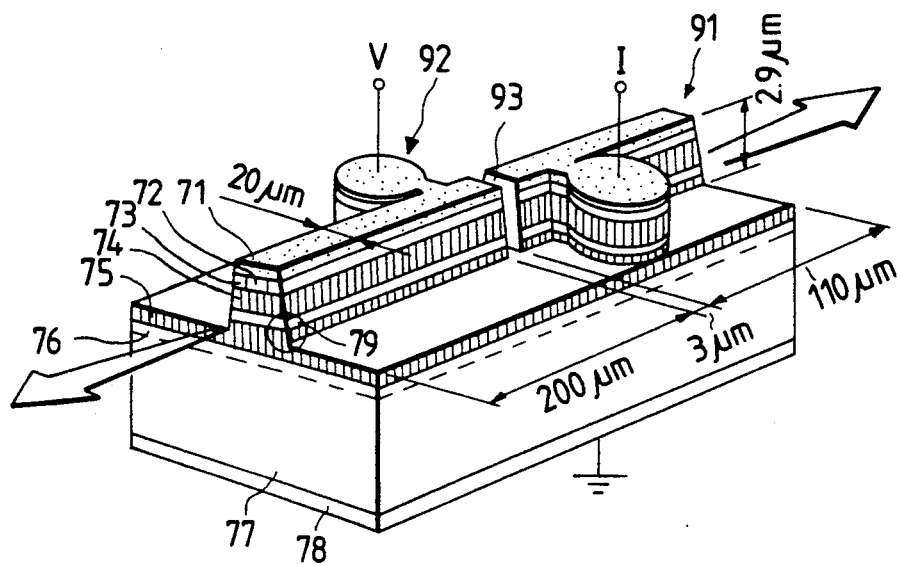
FIG. 4 is a schematic perspective view showing an example of a conventional device which is constructed by integrating a semiconductor laser and an optical modulator.
Figure 5:
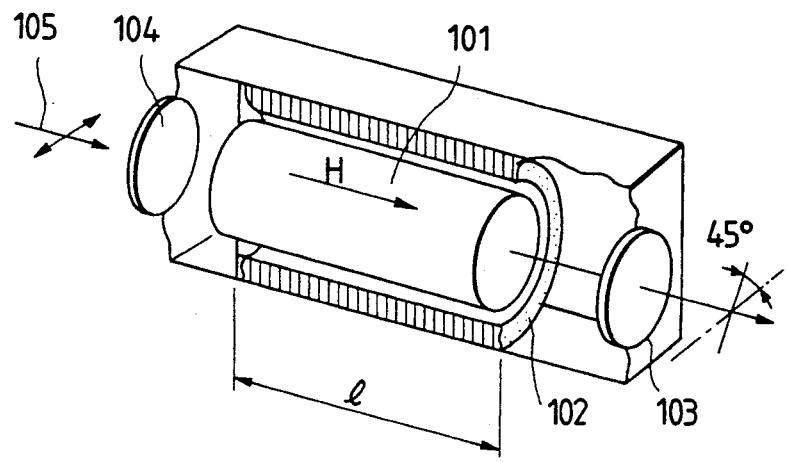
FIG. 5 is a perspective view with a part cut away showing an example of a conventional optical isolator.
Figure 6A:
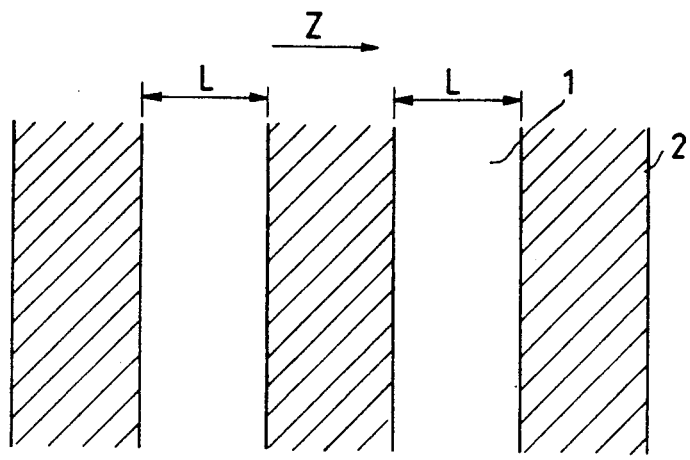
FIG. 6A is a schematic cross-sectional view of a quantum well layer in the device of the invention.
Figure 6B:
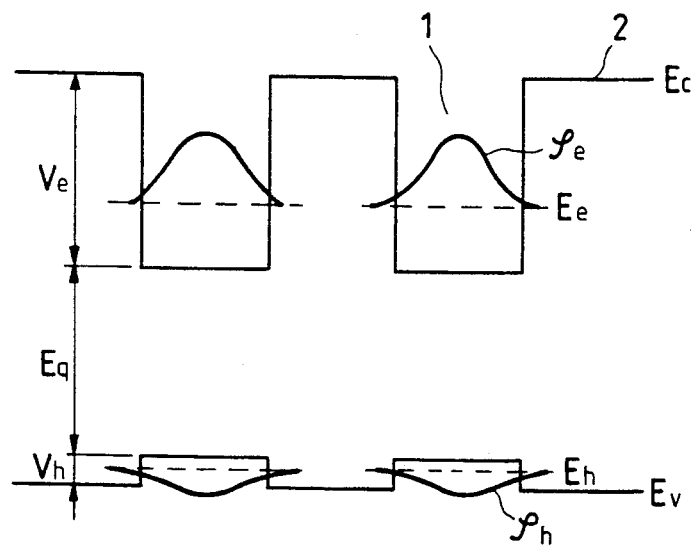
FIG. 6B is a diagram showing an energy band of the quantum well layer in FIG. 6A.

The magnetooptic device of the invention has an MQW structure as shown in a schematic cross-sectional view of FIG. 6A. The MQW structure is formed by alternately laminating a quantum well layer 1 having a thickness of L and a barrier layer 2 shown as a hatched region. FIG. 6B shows an energy band of the MQW structure of FIG. 6A. An energy gap $E_g$ of the quantum well layer 1 is smaller than that of the barrier layer 2. Quantum wells having energy depths of $V_e$ and $V_h$ are formed in a conductive band shown by an energy level $E_c$ and a valence band shown by an energy level $E_v$, respectively. Quantum levels $E_e$ and $E_h$ exist in the quantum wells, respectively.

The barrier layer 2 is a magnetic semiconductor layer and contains magnetic ions of Fe, Mn, and the like and magnetic moments are distributed at random. The well layer 1 is made of a semiconductor material and can contain the magnetic ions or do not need to contain the magnetic ions. As material systems suitable to form the well layer 1 and the barrier layer 2, a CdTe/CdMnTe system, a ZnSe/ZnMnSe system, a CdS/CdMnS system, a CdSe/CdMnSe system, an HgSe/HgMnSe system, an HgTe/HgMnTe system, and the like can be mentioned. In all of the above systems, the layer containing the Mn ions is used as a barrier layer.

An electric field F and a magnetic field $B_O$ are simultaneously vertically (Z direction in FIG. 6A) applied to the quantum well layer 1. When a single quantum well having a width L as shown in FIG. 7A is considered for simplicity of explanation and a potential height assumes $V_O$, a Hamiltonian to describe the motion of the carrier in the Z axis is obtained by the following equation (1) on the basis of the theory disclosed in "Solid State Commun.", Vol. 57, page 853, 1986 or the like.

$$h(z) = \frac{P_z^2}{2m} + \theta\left(|z| - \frac{L}{2}\right)\{V_0 - V_m(z)\} + eFz \quad (1)$$

The center of the quantum well is set to an of the z axis. $\theta(x)$ denotes a step function. $V_m(z)$ indicates a potential which is generated by the magnetic interaction and shows an exchange interaction between the magnetic moment in the barrier layer which was induced by the external magnetic field $B_O$ and the spin of the carrier in the quantum well. $P_z$ denotes a momentum of the carrier having a mass of m and a charge of e. The exchange interaction $V_m(z)$ in the equation (1) is expressed as follows if an average field approximation is used.

$$V_m(z) = \alpha \cdot J^z \cdot S \cdot N \cdot B_s(g\mu_B B_{eff}/kT) \quad (2)$$

$\alpha$ denotes an exchange interaction constant between the carrier and the magnetic ion; $J^z$ a z component of the carrier spin; S a size of spin of the magnetic ion; N the number of magnetic ions in a unit volume; $B_s(x)$ a Brillouin function; g a g factor; $\mu_B$ Bohr magneton; k Boltzmann's constant; and T temperature.

$B_{eff}$ in the equation (2) indicates an origin effective magnetic field which acts on the carrier and is expressed as follows.

$$B_{eff} = B_O + B_{ex}(z) \quad (3)$$

The second term of the right side in equation (3) denotes an internal magnetic field which is caused by the exchange interaction with the magnetic ions due to a leakage of the carrier from the quantum well into the barrier layer and is expressed as follows.

$$B_{ex}(z) = \frac{\alpha J^z S}{g\mu_B} |\psi(\vec{r})|^2 \theta\left(|z| - \frac{L}{2}\right) \quad (4)$$

$\Psi$ denotes a wave function of the carrier in the well layer which is obtained from a wave equation based on the equation (1). It will be understood from the equations (3) and (4) that the effective magnetic field $B_{eff}$ which the carrier feels increases as the wave function $\Psi$ leaks into the barrier layer.

As shown in FIG. 7B, the electric field F deforms the wave function $|\Psi|^2$ by inclining the potential, thereby raising an existence probability of the carrier in the barrier layer. Thus, it will be understood that the effective magnetic field $B_{eff}$ which acts on the carrier changes by turning on/off the electric field as shown in FIGS. 7A and 7B. This means that a degree of magnetooptic effect such as a Faraday rotation angle can be modulated by the electric field F.

Examination will now be made to see a degree of an internal magnetic field $B_{ex}$ which can be modulated by the control of the electric field. A difference $\Delta B_{ex}$ of the internal magnetic fields $B_{ex}$ in the cases when the electric field F was applied and when it is not applied at the well edge ($z = -L/2$) is expressed as follows.

$$\Delta B_{ex} = \frac{\alpha J^z S}{g\mu_B}\left\{\left|\psi\left(-\frac{L}{2}\right)\right|^2_{F\neq 0} - \left|\psi\left(-\frac{L}{2}\right)\right|^2_{F=0}\right\} \quad (5)$$

When assuming a Gaussian function as a wave function $\Psi$, it is expressed as follows.

$$\vec{\psi(r)} = \psi(z, \vec{R}) = \frac{\eta\sqrt{a}}{\pi^{\frac{3}{4}}} \cdot \exp(-\tfrac{1}{2}a^2 z^2)\exp(-\tfrac{1}{2}\eta^2 R^2) \quad (6)$$

$\vec{R}$ denotes a component which is parallel with an interface of a position vector $\vec{r}$. Symbols $\eta$ denote parameters indicative of extents of the wave function in the directions which are perpendicular to and parallel with the interface, respectively.

When it is assumed that only the central position of the wave function (with a distribution shape unchanged) deforms by only $\Delta z$ as shown in FIG. 7B by applying the electric field F, the difference $\Delta B_{ex}$ of the internal magnetic fields in the equation (5) is expressed as follows.

$$\Delta B_{ex} = \frac{\alpha J^z S}{g\mu_B} \cdot a^2 \cdot L \cdot \Delta z \left|\psi\left(-\frac{L}{2}, R\right)\right|^2 \quad (7)$$

$\Delta z$ is proportional to the magnitude of the electric field F and is expressed as follows.

$$\Delta z = -\frac{\sqrt{\pi}\, eF}{2V_0 a^3 L} \quad (8)$$

For instance, when CdTe is used as a quantum well layer and CdMnTe is used as a barrier layer, the change $\Delta B_{ex}$ in internal magnetic field in the case when the electric field F was applied to the potential well for the holes which are formed in the valence band is now calculated.

It is now assumed that a height $V_O$ of the potential barrier is set to 50 meV and a thickness L of the well layer is set to 50 Å and an extent (expressed by $a^{-1}$ and $\eta^{-1}$) of the wave function is set to 25 Å. In CdMnTe, magnitude $\alpha$ of the exchange interaction between the hole spin and the magnetic moment of the $Mn^{2+}$ ions is large because of the P-d interaction and is obtained as $-0.88$ eV/$N_O$. $N_O$ denotes the number of Cd site in a unit volume. A technique regarding the value of $\alpha$ has been disclosed in, for example, "Japan Applied Physics", Vol. 64, R29, 1988.

The equation (7) can be calculated from the equations (8) and (6) by assuming that $J^z = 3/2$ and $S = 5/2$. When the electric field F (=$10^5$ V/cm) is applied, $\Delta B_{ex}$ is calculated as follows.

$$\Delta B_{ex} \simeq 64 \text{ kG}$$

This means that the modulation of the internal magnetic field of at most about 10 kG is caused by applying the electric field of 100 kV/cm. Such a value is very large when considering that a magnetic field which can be applied by a permanent magnet or an electromagnet is generally equal to up to 10 kG. Further, since the electric field can be modulated at a rate of tens of GHz, the internal magnetic field also can be modulated at the same rate as above. When considering the case when the external magnetic field was modulated by controlling a current which is supplied to an electromagnet, an upper limit value of the modulation rate is equal to tens of MHz due to an increase in internal impedance. In comparison with such a case, it will be understood that the modulation rate according to the device of the invention is extremely high.

The device according to the invention uses the principle such that a degree of magnetooptic effect is modulated by controlling the applied electric field as mentioned above. Such a device can be used as an optical modulator of a high speed and a large modulation amplitude or an optical isolator having a high isolation ratio.

Figure 8:
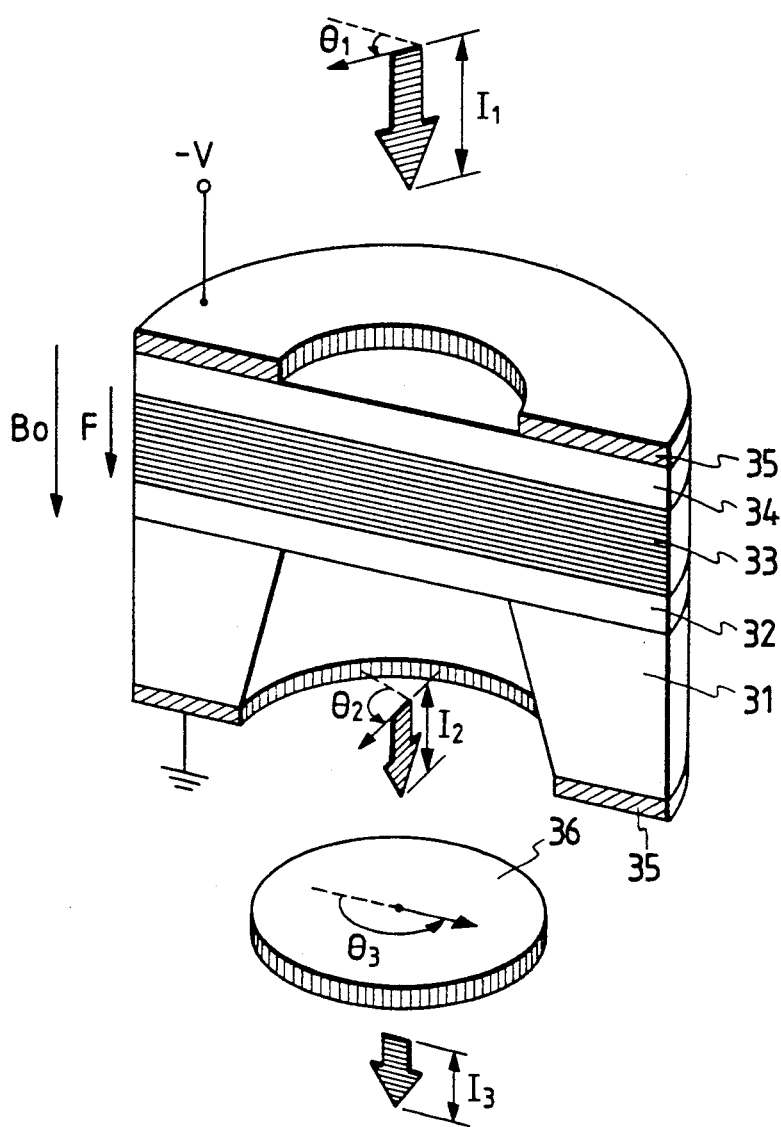
FIG. 8 is a perspective view with a part cut away showing an embodiment of an optical modulator to which the invention was applied.

FIG. 8 is a perspective view with a part cut away showing an example of a high speed optical modulator having a large modulation amplitude to which the invention was applied.

In the diagram, an In doped n-CdMnTe layer 32 (having a thickness of 0.5 μm), an MQW layer 33 of CdTe/CdMnTe, and an As doped p-CdMnTe layer 34 (having a thickness of 0.5 μm) are sequentially laminated on an n$^+$-GaAs substrate 31 by a molecular beam epitaxy (MBE) method or an organic metal chemical vapor deposition (MO-CVD) method. Those layers have a pin structure. Electrodes 35 are formed under the lower surface of the substrate 31 and on the upper surface of the CdMnTe layer 34, respectively. Holes to transmit the light are formed in the electrodes 35 and the substrate 31.

The MQW layer 33 is formed by alternately laminating a CdTe layer having a thickness of 50 Å as a well layer and a CdMnTe layer having a thickness of 100 Å as a barrier layer. A whole layer thickness is equal to 1 μm.

A magnetostatic field $B_O$ (~5 kG) is applied to the device with the above construction in the direction perpendicular to the film. A voltage of 10 V of an inverse bias is also simultaneously applied while being modulated. When the voltage is applied, a field intensity which is applied to the MQW layer 33 is set to 100 kV/cm.

Figure 9:
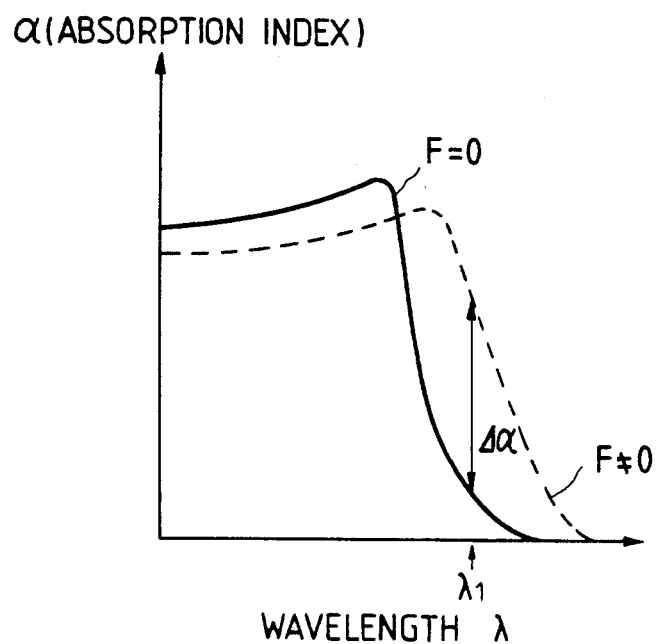
FIG. 9 is a diagram showing a light absorption spectrum in the optical modulator in FIG. 8.
Figure 10:
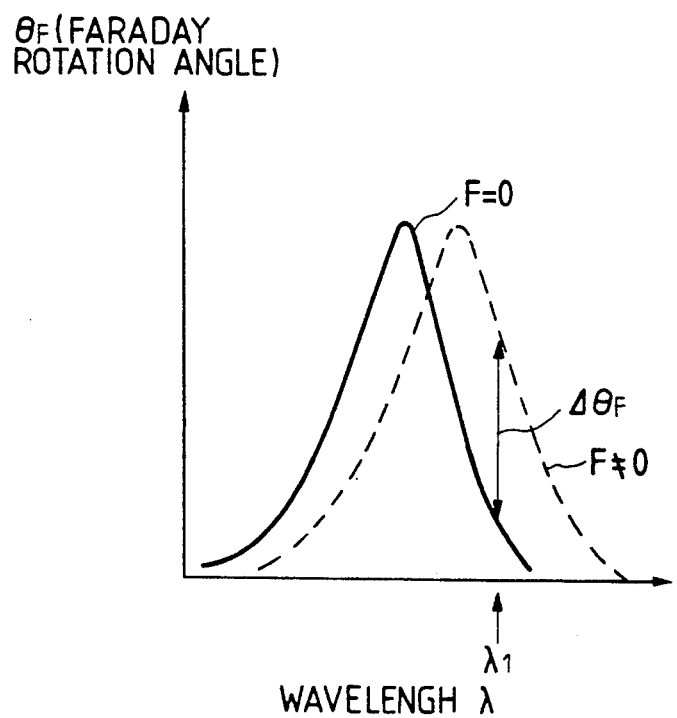
FIG. 10 is a diagram showing the relation between the wavelength of light and the Faraday rotation angle in the optical, modulator in FIG. 8.

In this case, wavelength dependencies of the absorption index $\alpha$ and the Faraday rotation angle $\theta_F$ of the MQW layer 33 under the constant external magnetic field $B_O$ are as shown in FIGS. 9 and 10, respectively. That is, as will be understood from FIG. 9, the absorption characteristics exhibit the red-shift by applying the electric field F ($\neq 0$) in a manner similar to the ordinary QCSE. On the other hand, as will be understood from FIG. 10, the Faraday rotation angle is modulated by the change (in this case, about 64 kG) in internal magnetic field as mentioned above.

Therefore, by setting a wavelength of input light to the device to $\lambda_1$ in FIGS. 9 and 10, the transmission light is simultaneously subjected to the intensity modulation and the modulation of the plane of polarization and is emitted from the device.

As shown in FIG. 8 when a linear polarization light which has an intensity of $I_1$ and whose polarizing direction is inclined at an angle of $\theta_1$ from a reference plane enters the device, the light is changed to the light having a light intensity of $I_2$ by a change $\Delta\alpha$ in absorption index by the QCSE in the case when the applied voltage is changed between 0 V to 10 V and is transmitted through the device. The polarizing direction of the transmission light is rotated by a Faraday effect so as to have an angle of $\theta_2$ from the reference plane.

By further passing the transmission light through a polarizer 36 whose main axis is inclined at an angle of $\theta_3$ from the reference plane, a change $\Delta\theta_F$ in Faraday rotation angle is converted into an intensity change and the light having an intensity $I_3$ is finally obtained. Now, there is a relation of $\Delta\theta_F = \theta_2 - \theta_1$.

Therefore, a magnitude of the modulation between the cases when the inverse-bias voltage was applied and when it is not applied is proportional to $$\Delta\alpha \times \Delta\theta_F$$

It will be understood that the modulation amplitude of the optical modulator according to the invention is large when considering that only $\Delta\alpha$ is used in the modulation by the ordinary QCSE. When also comparing with the case of executing the optical modulation by combining a change in Faraday rotation angle by the modulation of the external magnetic field and the polarizer, it will be understood that the modulation amplitude of the optical modulator according to the invention is large because not only a degree of change in Faraday rotation angle is large but also a change in absorption is used. In the embodiment, although the light has been input perpendicularly to the film surface, the invention also can be similarly applied to a waveguide type in which the light is input parallel to the film surface.

Figure 11:
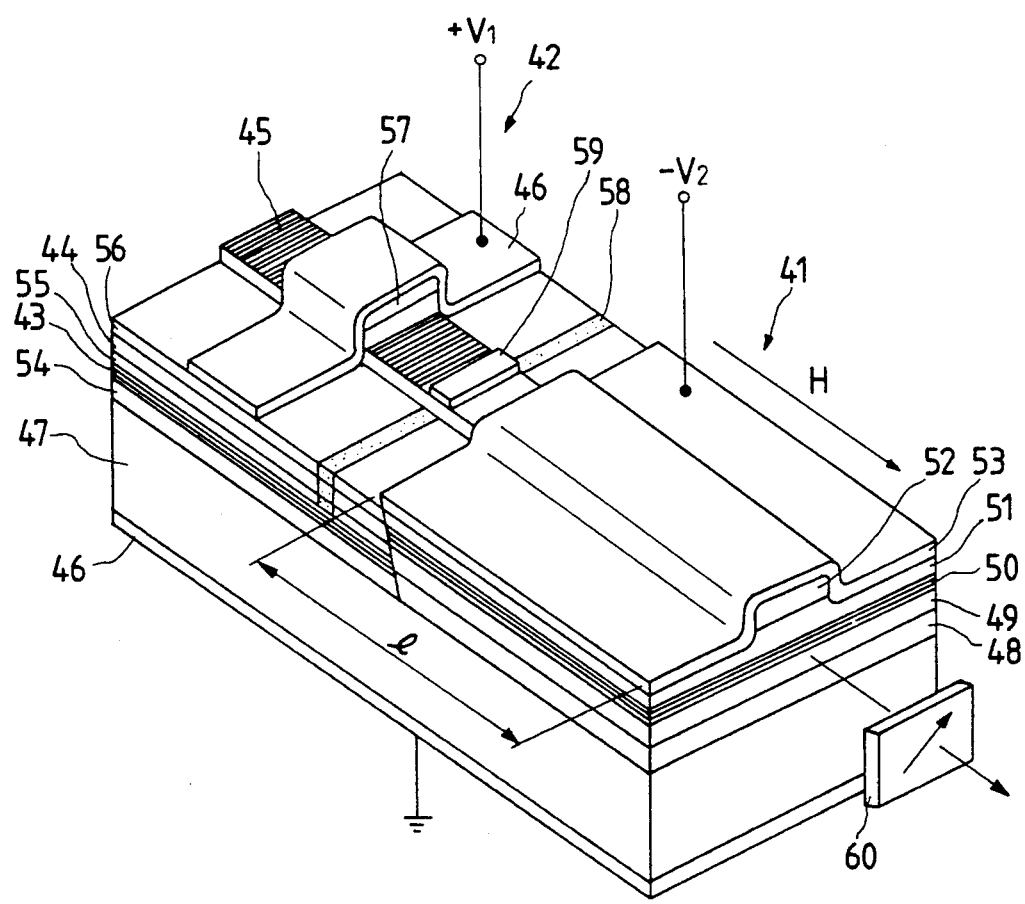
FIG. 11 is a schematic perspective view showing an embodiment of an optical isolator to which the invention was applied.

FIG. 11 is a schematic perspective view showing an embodiment in the case when the invention was applied to an optical isolator. The optical isolator intends to adjust the Faraday rotation angle by an electric field which is applied by using the foregoing principle. A device of the embodiment is constructed by monolithically forming an optical isolator and a semiconductor laser onto the same substrate.

In FIG. 11, an optical isolator section 41 and a distribution Bragg reflection (DBR) laser section 42 are integratedly formed on a substrate 47. The DBR laser section 42 is formed by laminating an active layer 43 and an optical waveguide layer 44. Gratings 45 constructing the DBR are formed on both sides of an electrode 46.

The optical isolator section 41 is formed on a portion which is obtained by cutting one side (right side in FIG. 11) of the laser section 42 by a taper etching process until the cut region reaches the substrate 47. The optical isolator section 41 is formed by sequentially laminating an n-CdTe buffer layer 48, an n-CdMnTe clad layer 49, an i-MQW layer 50, a p-CdMnTe clad layer 51, and a p$^+$-CdTe contact layer 52 onto the substrate 47. Further, by eliminating parts of the clad layer 51 and the contact layer 52 by etching, a ridge is formed. The MQW layer 50 functions as a channel type optical waveguide by the ridge. Electrodes 53 to apply an electric field to the MQW layer are formed on the upper surfaces of the clad layer 51 and the contact layer 52. The electrode 46 which is common to the laser section 42 and the optical isolator section 41 is formed under the lower surface of the substrate 47.

In a manner similar to the case mentioned in the description of the principle mentioned above, the i-MQW layer 50 has a super lattice structure comprising a CdTe well layer and a CdMnTe barrier layer. The i-MQW layer 50 is optically coupled with the waveguide layer 44 of the DBR layer section 42.

In FIG. 11, reference numeral 54 denotes an n-AlGaAs layer; 55 a p-AlGaAs layer; 56 a p-AlGaAs layer; 57 a p+-GaAs contact layer; 58 an insulating section; 59 a metal loaded polarizer; and 60 a polarizer.

In the above construction, a laser beam which is oscillated by the active layer 43 of the DBR laser section 42 is converted into a TE mode wave by the metal loaded polarizer 59. The laser beam passes through the optical waveguide layer 44 and propagates in the MQW layer 50 of the optical isolator section 41. A magnetic field shown by an arrow H is applied from the outside to the MQW layer 50. Therefore, the polarizing direction of the propagation light is rotated by the magnetooptic effect for a period of time when the propagation light propagates in the MQW layer 50, that is, what is called a mode modulation is executed. The propagation light is emitted from an emission edge surface of the MQW layer 50 as a light whose polarizing direction is rotated by 45° and passes through the polarizer 60. The polarizer 60 is arranged so that a transmission axis (main axis) is set to the same direction as the polarizing direction of the emission light, that is, it is set so as to have an angle of 45° from the layer surface of the MQW layer.

On the other hand, the return light of the emission light passes through the polarizer 60 and reversely moves in the isolator section 41 and the polarizing direction is further rotated by 45°, so that the return light is converted into the TM mode wave. Therefore, the return light is absorbed by the metal loaded polarizer 59 and does not enter the DBR laser section 42.

At this time, the length l of the optical isolator section 41 and the external magnetic field H are set so that the polarization plane of the laser beam is rotated by almost 45°. However, even if such a structure is merely used, there is a fear that an error occurs in the Faraday rotation angle. To prevent such a problem, according to the invention, an inverse-bias voltage $(-V_2)$ is applied to the pin structure of the optical isolator section 41. Due to this, the internal magnetic field is changed as described in the above principle and the Faraday rotation angle is finely adjusted. In this manner, the optical isolator can be finely adjusted so that the highest isolation ratio is derived.

As mentioned above, there is realized an optical isolator in which it is integrated together with the laser and a high isolation ratio can be obtained by finely adjusting the inverse-bias voltage even if the dimensional precision l of the device and the set accuracy of the external magnetic field H are not so severe.

As described above, according to the invention, by using a method of modulating a degree of magnetooptic effect by applying an electric field, an optical modulator of a high speed and a large modulation amplitude, an optical isolator having a high isolation ratio, or the like can be realized.

Since those devices can be formed as films onto the semiconductor substrate such as a GaAs substrate by the MBE method or MO-CVD method, an optical integrated circuit in which the devices are integratedly formed together with the laser and photo sensitive element can be formed.

The invention is not limited to only the foregoing embodiments but many variations and modifications are possible. For instance, the invention is not limited to the optical modulator and the optical isolator but also can be applied to all of the devices which control the magnetooptic effect by applying an electric field.

What is claimed is:

1. A magnetooptic device comprising:
   a substrate;
   a semiconductor layer having a quantum well structure formed on the substrate, in which the semiconductor layer is formed by alternately laminating a well layer and a barrier layer and at least the barrier layer in said layers comprises magnetic ions; and
   electrodes for applying an electric field to the semiconductor layer.

2. A device according to claim 1, wherein the well layer and the barrier layer are made of either ones of: CdTe and CdMnTe; ZnSe and ZnMnSe; CdS and CdMnS; CdSe and CdMnSe; HgSe and HgMnSe; and HgTe and HgMnTe.

3. A method of driving a magnetooptic device comprising (1) a substrate, (2) a semiconductor layer having a quantum well structure formed on the substrate, said semiconductor layer being formed by alternately laminating a well layer and a barrier layer and at least the barrier layer in said layers comprising magnetic ions, and (3) electrodes for applying an electric field to the semiconductor layer, said method comprising the steps of:
   inputting a light beam which is polarized in a predetermined direction into the semiconductor layer;
   applying a magnetic field to the semiconductor layer;
   applying an electric field to the semiconductor layer by the electrodes; and
   extracting the light beam which was transmitted in the semiconductor layer.

4. A magnetooptic device comprising:
   a substrate;
   a semiconductor layer having a quantum well structure which is formed on the substrate and transmits a light beam which enters from outside, in which the semiconductor layer is formed by alternately laminating a well layer and a barrier layer and at least the barrier layer in said layer comprises magnetic ions; and
   electrodes for applying an electric field to the semiconductor layer,
   wherein when the electric field is applied to the semiconductor layer, a degree of leakage of a wave function of a carrier in the well layer into the barrier layer changes and an effective magnetic field influencing a carrier spin changes by an exchange interaction between the carrier spin and a magnetic moment associated with the magnetic ions, so that a degree of magnetooptic effect applied to the transmission light beam changes.

5. A device according to claim 4, wherein the well layer and the barrier layer are made of either ones of: CdTe and CdMnTe; ZnSe and ZnMnSe; CdS and CdMnS; CdSe and CdMnSe; HgSe and HgMnSe; and HgTe and HgMnTe.

6. A method of driving a magnetooptic device comprising (1) a substrate, (2) a semiconductor layer having a quantum well structure formed on the substrate, said semiconductor layer being formed by alternately laminating a well layer and a barrier layer and at least the barrier layer in said layers comprising magnetic ions, and (3) electrodes for applying an electric field to the semiconductor layer, said method comprising the steps of:

inputting a light beam which is polarized in a predetermined direction into the semiconductor layer;

applying a magnetic field to the semiconductor layer;

applying an electric field to the semiconductor layer by the electrode, in which by applying the electric field, a degree of leakage of a wave function of a carrier in the well layer into the barrier layer changes and an effective magnetic field influencing a carrier spin changes by an exchange interaction between the carrier spin and a magnetic moment associated with the magnetic ions, so that a degree of magnetooptic effect applied to the incident light beam changes; and extracting the light beam whose polarizing direction is rotated by the magnetooptic effect and which is transmitted in the semiconductor layer.

7. A magnetooptic device comprising:

a substrate;

a first semiconductor layer having a first polarity formed on the substrate;

a multiple quantum well layer formed on the first semiconductor layer, in which the multiple quantum well layer is formed by alternately laminating a well layer and a barrier layer and at least the barrier layer in said layers comprises magnetic ions;

a second semiconductor layer which is formed on the multiple quantum well layer and has a second polarity opposite to the first polarity;

a first electrode formed on the second semiconductor layer; and a second electrode formed under a lower surface of the substrate.

8. A device according to claim 7, wherein the well layer and the barrier layer are made of either ones of: CdTe and CdMnTe; ZnSe and ZnMnSe; CdS and CdMnS; CdSe and CdMnSe; HgSe and HgMnSe; and HgTe and HgMnTe.

9. A method of driving a magnetooptic device comprising (1) a substrate, (2) a first semiconductor layer having a first polarity formed on the substrate, a multiple quantum well layer formed on the first semiconductor layer, said multiple quantum well layer being formed by alternately laminating a well layer and a barrier layer and at least the barrier layer in said layers comprising magnetic ions, (3) a second semiconductor layer which is formed on the multiple quantum well layer and has a second polarity opposite to the first polarity, (4) a first electrode formed on the second semiconductor layer, and (5) a second electrode formed under a lower surface of the substrate, said method comprising the steps of:

inputting a light beam which is polarized in a predetermined direction into the multiple quantum well layer;

applying a magnetic field to the multiple quantum well layer;

applying a voltage of an inverse bias between the first and second electrodes; and extracting the light beam which is transmitted in the quantum well layer.

10. An optical modulator comprising:

a substrate;

a semiconductor layer which is formed on the substrate and has a quantum well structure formed so as to transmit a light beam which is polarized in a predetermined direction, in which the semiconductor layer is formed by alternately laminating a well layer and a barrier layer and at least the barrier layer in said layers comprises magnetic ions;

electrodes for applying an electric field to the semiconductor layer; and a polarizer for converting a rotation of a polarizing direction of the light beam which is transmitted in the semiconductor layer into an intensity modulation of the light beam.

11. An optical modulator according to claim 10, wherein the substrate and the electrodes each comprise holes for inputting the light beam into the semiconductor layer and extracting the light beam which is transmitted in the semiconductor layer.

12. An optical modulator according to claim 10, wherein a light absorption index of the semiconductor layer changes by a quantum confined Stark effect when the electric field is applied.

13. An optical modulator according to claim 10, wherein the well layer and the barrier layer are made of either ones of: CdTe and CdMnTe; ZnSe and ZnMnSe; CdS and CdMnS; CdSe and CdMnSe; HgSe and HgMnSe; and HgTe and HgMnTe.

14. A method of driving an optical modulator comprising (1) a substrate, (2) a semiconductor layer having a quantum well structure formed on the substrate, said semiconductor layer being formed by alternately laminating a well layer and a barrier layer and at least the barrier layer in said layers comprising magnetic ions, (3) electrodes for applying an electric field to the semiconductor layer, and (4) a polarizer, said method comprising the steps of:

inputting a light beam which is polarized in a predetermined direction into the semiconductor layer;

applying a magnetic field to the semiconductor layer;

applying the electric field to the semiconductor layer by the electrodes;

extracting the light beam whose polarizing direction is rotated and is transmitted in the semiconductor layer; and allowing the extracted light beam to pass through the polarizer and converting a rotation of the polarizing direction into an intensity modulation of the light beam.

15. An optical modulator comprising:

a substrate;

a semiconductor layer which is formed on the substrate and has a quantum well structure formed so as to transmit a light beam which is polarized in a predetermined direction, in which the semiconductor layer is formed by alternately laminating a well layer and a barrier layer and at least the barrier layer in said layers comprises magnetic ions;

electrodes for applying an electric field to the semiconductor layer, in which when the electric field is applied to the semiconductor layer, a degree of leakage of a wave function of a carrier in the well layer into the barrier layer changes and an effective magnetic field influencing a carrier spin changes by an exchange interaction between the carrier spin and a magnetic moment associated with the magnetic ions, so that a degree of magnetooptic effect applied to the transmission light beam changes; and a polarizer for converting the light beam whose polarizing direction is rotated by the magnetooptic effect into the light beam which is intensity modulated.

16. An optical modulator according to claim 15, wherein the substrate and the electrodes each comprise holes for inputting the light beam into the semiconductor layer and extracting the light beam which is transmitted in the semiconductor layer.

17. An optical modulator according to claim 15, wherein a light absorption index of the semiconductor layer changes by a quantum confined Stark effect when the electric field is applied.

18. An optical modulator according to claim 15, wherein the well layer and the barrier layer are made of either ones of: CdTe and CdMnTe; ZnSe and ZnMnSe; CdS and CdMnS; CdSe and CdMnSe; HgSe and HgMnSe; and HgTe and HgMnTe.

19. A method of driving an optical modulator comprises (1) a substrate, (2) a semiconductor layer having a quantum well structure formed on the substrate, said semiconductor layer being formed by alternately laminating a well layer and a barrier layer and at least the barrier layer in said layers comprising magnetic ions, (3) electrodes for applying an electric field to the semiconductor layer, and (4) a polarizer, said method comprising the steps of:

inputting a light beam which is polarized in a predetermined direction into the semiconductor layer;

applying a magnetic field to the semiconductor layer;

applying the electric field to the semiconductor layer by the electrodes, in which by applying the electric field, a degree of leakage of a wave function of a carrier in the well layer into the barrier layer changes and an effective magnetic field influencing a carrier spin changes by an exchange interaction between the carrier spin and a magnetic moment associated with the magnetic ions, so that a degree of magnetooptic effect applied to the incident light beam changes;

extracting the light beam whose polarizing direction is rotated by the magnetooptic effect and which is transmitted in the semiconductor layer; and allowing the extracted light beam to pass through the polarizer and converting a rotation of the polarizing direction into an intensity modulation of the light beam.

20. An optical isolator comprising:

a first polarizer to transmit light which is polarized in a predetermined direction;

a semiconductor layer having a quantum well structure into which the light which is transmitted through the first polarizer enters, in which the semiconductor layer is formed by alternately laminating a well layer and a barrier layer and at least the barrier layer in said layers contains magnetic ions and the semiconductor layer rotates a polarizing direction of the incident light which it emits;

electrodes to apply an electric field to the semiconductor layer; and a second polarizer to transmit the light which is emitted from the semiconductor layer.

21. An optical isolator according to claim 20, wherein an angle between transmission axes of said first and second polarizers is set to 45°.

22. An optical isolator according to claim 20, wherein the well layer and the barrier layer are made of either ones of: CdTe and CdMnTe; ZnSe and ZnMnSe; CdS and CdMnS; CdSe and CdMnSe; HgSe and HgMnSe; and HgTe and HgMnTe.

23. A method of adjusting an optical isolator comprising (1) a first polarizer, (2) a second polarizer, (3) a semiconductor layer having a quantum well structure, said semiconductor layer being formed by alternately laminating a well layer and a barrier layer and at least the barrier layer in said layers containing magnetic ions, and (4) electrodes to apply an electric field to the semiconductor layer, said method comprising the steps of:

inputting light which is transmitted in the first polarizer into the semiconductor layer;

applying a magnetic field to the semiconductor layer;

extracting the light whose polarizing direction is rotated by the semiconductor layer from the semiconductor layer;

inputting the extracted light into the second polarizer; and applying the electric field from the electrodes to the semiconductor layer and adjusting a rotating angle of the polarizing direction of the light.

24. A method according to claim 23, wherein an angle between transmission axes of the first and second polarizers is set to 45°.

25. An optical isolator comprising:

a first polarizer to transmit light which is polarized in a predetermined direction;

a semiconductor layer having a quantum well structure into which the light which is transmitted in the first polarizer enters, in which the semiconductor layer is formed by alternately laminating a well layer and a barrier layer and at least the barrier layer in said layers contains magnetic ions and the semiconductor layer rotates the polarizing direction of the incident light which it emits;

electrodes to apply an electric field to the semiconductor layer, in which when the electric field is applied to the semiconductor layer, a degree of leakage of a wave function of a carrier in the well layer into the barrier layer changes and an effective magnetic field which a carrier spin feels changes by an exchange interaction between the carrier spin and a magnetic moment associated with the magnetic ions, so that a rotation angle of the polarizing direction of the incident light changes; and a second polarizer to transmit the light which is emitted from the semiconductor layer.

26. An optical isolator according to claim 25, wherein an angle between transmission axes of the first and second polarizers is set to 45°.

27. An optical isolator according to claim 25, wherein the well layer and the barrier layer are made of either ones of: CdTe and CdMnTe; ZnSe and ZnMnSe; CdS and CdMnS; CdSe and CdMnSe; HgSe and HgMnSe; and HgTe and HgMnTe.

28. A method of adjusting an optical isolator comprising (1) a first polarizer, (2) a second polarizer, (3) a semiconductor layer having a quantum well structure, said semiconductor layer being formed by alternately laminating a well layer and a barrier layer and at least the barrier layer in said layers containing magnetic ions, and (4) electrodes to apply an electric field to the semiconductor layer, said method comprising the steps of:

inputting light which is transmitted in the first polarizer into the semiconductor layer;

applying a magnetic field to the semiconductor layer;

extracting the light whose polarizing direction is rotated by the semiconductor layer from the semiconductor layer;

inputting the extracted light into the second polarizer; and applying the electric field from the electrodes to the semiconductor layer, thereby changing a degree of leakage of a wave function of a carrier in the well layer into the barrier layer and changing an effective magnetic field which a carrier spin feels by an exchange interaction between the carrier spin and a magnetic moment associated with the magnetic ions, and thereby eventually adjusting a rotation angle of the polarizing direction of the light.

29. A method according to claim 28, wherein an angle between transmission axes of the first and second polarizers is set to 45°.

30. An optical isolator comprising:
a first polarizer to transmit light which is polarized in a predetermined direction;
a substrate;
a first clad layer having a first polarity formed on the substrate;
a waveguide layer which is formed on the first clad layer and having a quantum well structure into which the light which is transmitted in the first polarizer enters, in which the waveguide layer is formed by alternately laminating a well layer and a barrier layer and at least the barrier layer in said layers contains magnetic ions and the waveguide layer propagates the incident light and rotates a polarizing direction of the incident light which it emits;
a second clad layer which is formed on the waveguide layer and has a polarity opposite to the first polarity;
electrodes to apply an electric field to the waveguide layer; and
a second polarizer to transmit the light which is emitted from the waveguide layer.

31. An optical isolator according to claim 30, wherein an angle between transmission axes of the first and second polarizers is set to 45°.

32. An optical isolator according to claim 30, wherein the well layer and the barrier layer are made of either ones of: CdTe and CdMnTe; ZnSe and ZnMnSe; CdS and CdMnS; CdSe and CdMnSe; HgSe and HgMnSe; and HgTe and HgMnTe.

33. An optical isolator comprising:
a first polarizer to transmit light which is polarized in a predetermined direction;
a substrate;
a first clad layer having a first polarity formed on the substrate;
a waveguide layer which is formed on the first clad layer and has a quantum well structure into which light which is transmitted in the first polarizer enters, in which the waveguide layer is formed by alternately laminating a well layer and a barrier layer and at least the barrier layer in said layers contains magnetic ions and the waveguide layer propagates the incident light and rotates a polarizing direction of the incident light which it emits;
a second clad layer which is formed on the waveguide layer and has a polarity opposite to the first polarity;
electrodes to apply an electric field to the waveguide layer, in which when the electric field is applied to the waveguide layer, a degree of leakage of a wave function of a carrier in the well layer into the barrier layer changes and an effective magnetic field which a carrier spin feels changes by an exchange interaction between the carrier spin and a magnetic moment associated with the magnetic ions, so that a rotation angle in the polarizing direction of the emission light changes; and
a second polarizer to transmit the light which is emitted from the waveguide layer.

34. An optical isolator according to claim 33, wherein an angle between transmission axes of the first and second polarizers is set to 45°.

35. An optical isolator according to claim 33, wherein the well layer and the barrier layer are made of either ones of: CdTe and CdMnTe; ZnSe and ZnMnSe; CdS and CdMnS; CdSe and CdMnSe; HgSe and HgMnSe; and HgTe and HgMnTe.

36. An optical isolator which is integrated with a semiconductor laser, said optical isolator comprising:
a substrate;
a laser section which is formed on the substrate and is constructed by a semiconductor active layer to generate a laser beam when a current is supplied and a first electrode to supply a current to the active layer; and
an isolator section formed on the same substrate as that of the laser section, said isolator section comprising (1) a waveguide layer formed by alternately laminating a well layer and a barrier layer, at least the barrier layer in said layers including magnetic ions, and (2) a second electrode to apply an electric field to the waveguide layer.

37. An optical isolator according to claim 36, further comprising:
a first polarizer provided between the laser section and the isolator section; and
a second polarizer arranged in an optical path of light which is generated from the laser section and is propagated in the isolator section and is emitted.

38. An optical isolator according to claim 37, wherein an angle between transmission axes of the first and second polarizers is set to 45°.

39. An optical isolator according to claim 36, further comprising an insulating section provided between the laser section and the isolator section.

40. An optical isolator according to claim 36, wherein the well layer and the barrier layer are made of either ones of: CdTe and CdMnTe; ZnSe and ZnMnSe; CdS and CdMnS; CdSe and CdMnSe; HgSe and HgMnSe; and HgTe and HgMnTe.

41. An optical isolator according to claim 36, wherein the laser section further comprises a second waveguide layer for propagating the light emitted from the active layer and leading to the waveguide layer of the isolator section.

42. A method of driving a magnetooptic device comprising (1) a substrate, (2) a laser section including a semiconductor active layer formed on the substrate, and a first electrode for supplying a current to the active layer, and (3) an isolator including a waveguide layer formed on the substrate, said waveguide layer being formed by alternately laminating a well layer and a barrier layer and at least the barrier layer in said layers containing magnetic ions, and a second electrode for applying an electric field to the waveguide layer, said method comprising the steps of:
  generating a laser beam by supplying a current from the first electrode to the active layer;
  applying a magnetic field to the waveguide layer;
  propagating the laser beam generated in the active layer into the waveguide layer and rotating a polarizing direction of the laser beam; and
  applying the electric field from the second electrode to the waveguide layer, thereby adjusting a rotation angle in the polarizing direction of the propagation light.

* * * * *

UNITED STATES PATENT AND TRADEMARK OFFICE
CERTIFICATE OF CORRECTION

PATENT NO. : 5,173,955

DATED : December 22, 1992

INVENTOR(S) : Masamichi Yamanishi, et al.

It is certified that error appears in the above-identified patent and that said Letters Patent is hereby corrected as shown below:

COLUMN 2

Line 47, "a" should be deleted.

COLUMN 4

Line 44, "optical," should read --optical--.

COLUMN 5

Line 24, "an" should read --an origin--.

COLUMN 6

Line 27, "Symbols" should read --Symbols a and--.

COLUMN 8

Line 19, "$\Delta\theta_F=\theta_2- \leftarrow_1.$" should read --$\Delta\theta_F=\theta_2- \theta_1.$--.

UNITED STATES PATENT AND TRADEMARK OFFICE
CERTIFICATE OF CORRECTION

PATENT NO. : 5,173,955
DATED : December 22, 1992
INVENTOR(S) : Masamichi Yamanishi, et al.

It is certified that error appears in the above-identified patent and that said Letters Patent is hereby corrected as shown below:

COLUMN 11

Line 14, "electrode," should read --electrodes,--.

COLUMN 13

Line 23, "prises" should read --prising--.

Signed and Sealed this

First Day of March, 1994

Attest:

BRUCE LEHMAN

Attesting Officer        Commissioner of Patents and Trademarks